(12) United States Patent
Imadate

(10) Patent No.: US 6,713,694 B2
(45) Date of Patent: Mar. 30, 2004

(54) RESET MECHANISM FOR USE IN ELECTRIC DEVICE EQUIPPED WITH MICROCOMPUTER AND RESETTING METHOD

(75) Inventor: Hiroyuki Imadate, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 0 days.

(21) Appl. No.: 10/238,736

(22) Filed: Sep. 11, 2002

(65) Prior Publication Data

US 2003/0048602 A1 Mar. 13, 2003

(30) Foreign Application Priority Data

Sep. 13, 2001 (JP) ........................... 2001-278191

(51) Int. Cl.⁷ ............................................. H01R 31/08
(52) U.S. Cl. ................. 200/43.05; 200/43.01; 200/345; 200/512
(58) Field of Search ................... 200/43.05, 43.01, 200/43.04, 43.09, 43.13, 43.12, 43.18, 43.19, 345, 341, 5 A, 512, 520

(56) References Cited

U.S. PATENT DOCUMENTS 5,070,212 A * 12/1991 Gabetta et al. ............. 549/399
5,565,666 A * 10/1996 Kautz ........................ 200/83 P
5,803,237 A * 9/1998 Gandre et al. ............ 200/43.01
5,947,270 A * 9/1999 Lindholm ................... 200/460
6,002,093 A * 12/1999 Hrehor et al. .............. 200/345

FOREIGN PATENT DOCUMENTS

| JP | 5-120952 | 5/1993 |
| JP | 6-076689 | 3/1994 |

* cited by examiner

Primary Examiner—K. Lee
(74) Attorney, Agent, or Firm—Wenderoth, Lind & Ponack, L.L.P.

(57) ABSTRACT

Disclosed is a reset mechanism for use in an electric device equipped with a microcomputer having a reset circuit associated therewith. An insulating housing of the electric device has a small through hole provided therein, and chassis of the electric device has a small through hole provided therein and in alignment with the small through hole of the insulating housing. A reset terminal of the reset circuit is placed behind the small through hole of the chassis of the electric device. The microcomputer can be reset simply by inserting a metal rod into the two through holes as far as the reset circuit.

13 Claims, 2 Drawing Sheets

RESET MECHANISM FOR USE IN ELECTRIC DEVICE EQUIPPED WITH MICROCOMPUTER AND RESETTING METHOD

BACKGROUND OF THE INVENTION

1. Field of the Invention

The present invention relates to a reset mechanism to be used in resetting a microprocessor, or the like, installed in an electric device.

2. Related Art

Nowadays there are a variety of electronic devices each having various functions. Such an electronic device has a microcomputer installed therein for controlling its numerous electrical circuits. The microcomputer, however, cannot work correctly when being supplied with incorrect signals or when something is wrong in an associated electrical circuit. It may be possible that such malfunctions are caused by certain surrounding factors.

To recover the microcomputer from such a defective condition, it is necessary that the microcomputer be made to stop working. For this purpose the microcomputer is equipped with a reset switch. Such a reset switch is designed to be used exclusively for resetting the microcomputer. The reset switch, however, is not used often, and therefore, providing the microcomputer with such an extra switch for exclusive use is undesirable from a perspective of manufacturing cost.

Hitherto, a variety of reset switches have been proposed, as for instance, follows: Japan Patent 06-76689(A) discloses a "reset switch"; and Japan Patent 05-120952(A) discloses a "reset switch for electric equipment". These reset switches are simple in structure as compared with switches which were used before, but these reset switches are still designed to be exclusively used for resetting a microcomputer.

SUMMARY OF THE INVENTION

In view of the above one object of the present invention is to provide a reset mechanism for resetting an electrical circuit or electronic device, such as a microcomputer, without necessity of providing the electronic device with an extra switch used exclusively for a purpose of resetting the microcomputer.

To attain this object according to the present invention, a reset mechanism for use in an electric device equipped with a microcomputer having a reset circuit associated therewith, is characterized in that an insulating housing of the electric device has a small through hole provided therein; a chassis of the electric device has a small through hole provided therein and in alignment with the small through hole of the insulating housing; and that a reset terminal of the reset circuit is placed behind the small through hole of the chassis of the electric device.

In place of the chassis of the electric device, a metal casing or mount of a selected part of the electric device may have a small through hole provided therein and in alignment with the small through hole of the insulating housing.

Another object of the present invention is to provide a method for resetting an electric circuit or electronic device such as a microcomputer without recourse of a reset switch used exclusively for resetting the microcomputer.

To attain this object according to the present invention, a method of resetting an electric device equipped with a microcomputer having a reset circuit associated therewith, comprises: providing a small through hole in an insulating housing of the electric device; providing a small through hole in a chassis of the electric device so as to be in alignment with the small through hole of the insulating housing and also in alignment with a reset terminal of the reset circuit, which reset circuit is placed behind the small through hole of the chassis of the electric device; and inserting an electrically conductive rod in the small through holes in the insulating housing and the chassis of the electric device so as to touch the reset terminal, thereby making an electrical connection between the reset terminal and the chassis of the electric device.

Other objects and advantages of the present invention will be understood from the following description of a reset mechanism according to one embodiment of the present invention, which is shown in accompanying drawings.

DETAILED DESCRIPTION OF PREFERRED EMBODIMENT

Figure 1:
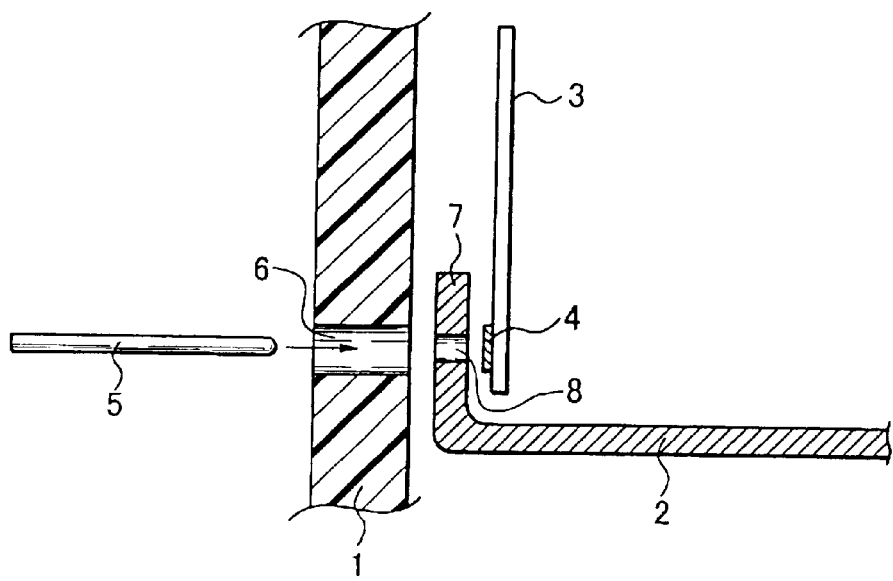
FIG. 1 shows, in section, a reset mechanism according to the present invention.

FIG. 1 shows a reset mechanism disposed at a front part of an electric device equipped with a microcomputer having a reset circuit 4 associated therewith. The reset circuit 4 is built in a printed circuit board 3. An insulating housing of the electric device is made of a synthetic resin material, and it has a small through hole 6 provided in its front plate 1. A metal chassis 2 of the electric device has a small through hole 8 provided in its front rise 7. The small through hole 8 is in alignment with the small through hole 6 of the front plate 1 of the insulating housing.

The reset circuit 4 is placed behind the small through hole 8 of the chassis 2 of the electric device. When it is desired that a microcomputer is reset, an electrically conductive rod 5 is inserted into the small through holes 6 and 8 in the insulating housing and the chassis 2 so as to touch the reset circuit 4, thereby making an electrical connection between the reset circuit 4 and the chassis 2, which is grounded.

In this particular embodiment, the through hole 6 is provided in the front plate 1 of the insulating housing, but the through hole 6 can be provided in a rear, either side or bottom plate of the insulating housing, provided that access to the reset circuit 4 is permitted via the small through holes 6 and 8 in the insulating housing and the chassis 2. The electrically conductive rod 5 may be a nail, pin or a short wire.

Usually a microcomputer or a reset signal generator compares a certain voltage from an associated voltage regulator with a predetermined reference voltage at all times to generate a reset signal when an unusual working condition is detected in terms of a result of this comparison. When an electrical connection is made between the metal chassis 2 and the reset circuit 4 via the electrically conductive rod 5, a voltage appearing at a given point in the reset circuit 4 changes to provide a reset signal for resetting the microcomputer.

Figure 2:
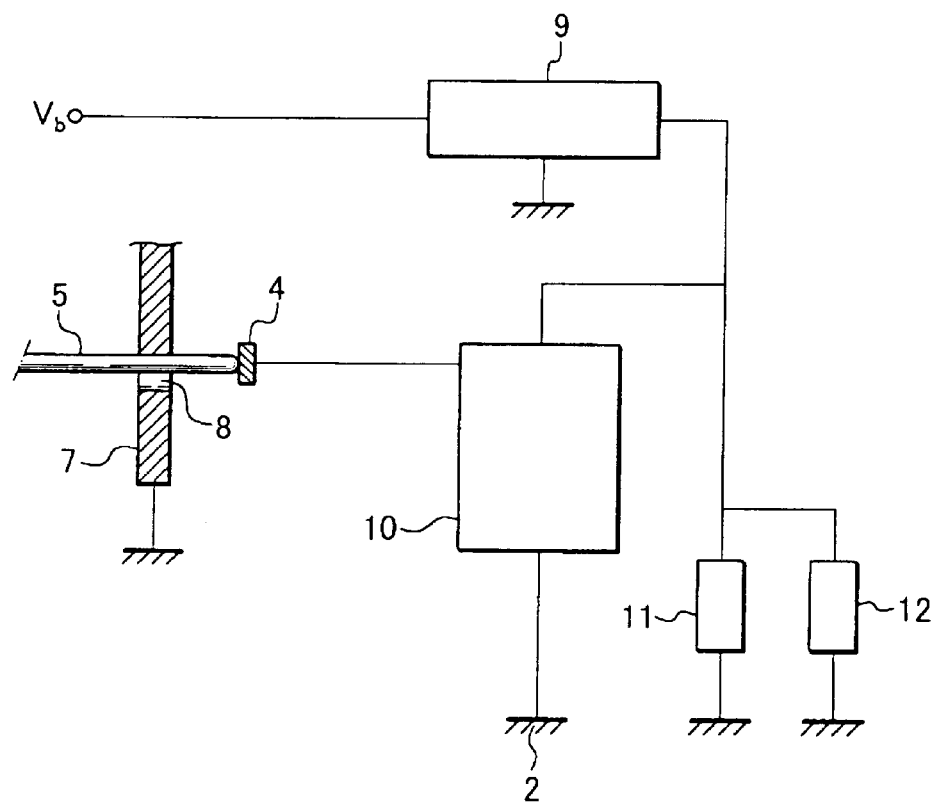
FIG. 2 is a wiring diagram of the reset mechanism.

Referring to FIG. 2, a voltage regulator 9 is connected to a microcomputer 10, which is connected to the reset circuit 4. The voltage regulator 9 and the microcomputer 10 are connected to loads 11 and 12, which are associated with an electric apparatus. As shown in this drawing, a voltage $V_b$ is applied to the microcomputer 10 via the voltage regulator 9, and the metal chassis 2 is grounded.

When the microcomputer 10 is reset, a metal rod 5 is inserted into the through hole 8 of the chassis 2 until it reaches the reset circuit 4, and at the same time, the metal rod 5 touches the metal chassis 2, thereby causing voltage at a certain point in the reset circuit 4 to change. As a result, a reset signal appears to reset the microcomputer 10.

The through hole 8 is provided in the front rise of the chassis 2. However, the through hole 8 may be provided in an electrically conductive part of the electric device other than the chassis 2.

The reset mechanism according to the present invention provides the following advantages.

No extra switch is required for resetting. In resetting a microcomputer it suffices that a metal rod is inserted into two series-arranged through holes as far as a reset circuit. The reset mechanism is simple in structure, compared with a conventional reset switch, and accordingly a manufacturing cost can be reduced.

What is claimed is:

1. A method of resetting an electric device equipped with a microcomputer having a reset circuit associated therewith, comprising:

providing a small through hole in an insulating housing of said electric device;

providing a small through hole in a chassis of said electric device so as to be in alignment with said small through hole in said insulating housing and also in alignment with a reset terminal of said reset circuit, said reset circuit being placed behind said small through hole in said chassis; and inserting an electrically conductive rod into said small through holes in said insulating housing and said chassis so as to touch said reset terminal, thereby making an electrical connection between said reset terminal and said chassis.

2. A reset mechanism for use in an electric device that is equipped with a microcomputer having a reset circuit associated therewith, comprising:

a first through hole in an insulating housing of the electric device;

a second through hole in a member of the electric device and in alignment with said first through hole; and a reset terminal of the reset circuit, said reset terminal being positioned behind said second through hole and exposed so as to be directly accessible from an exterior of said insulating housing via said first and second through holes.

3. The reset mechanism according to claim 2, wherein said member of the electric device comprises a chassis of the electric device.

4. The reset mechanism according to claim 3, wherein said reset terminal is exposed by there being no structure between said reset terminal and an outer end of said first through hole.

5. The reset mechanism according to claim 4, further comprising:

an electrically conductive rod that is constructed and arranged to pass through said first and second through holes and contact said reset terminal and said chassis to thereby electrically connect said reset terminal to said chassis.

6. The reset mechanism according to claim 3, further comprising:

an electrically conductive rod that is constructed and arranged to pass through said first and second through holes and contact said reset terminal and said chassis to thereby electrically connect said reset terminal to said chassis.

7. The reset mechanism according to claim 2, wherein said member of the electric device comprises a metal casing or mount of a selected part of the electric device.

8. The reset mechanism according to claim 7, wherein said reset terminal is exposed by there being no structure between said reset terminal and an outer end of said first through hole.

9. The reset mechanism according to claim 8, further comprising:

an electrically conductive rod that is constructed and arranged to pass through said first and second through holes and contact said reset terminal and said metal casing or mount to thereby electrically connect said reset terminal to said metal casing or mount.

10. The reset mechanism according to claim 7, further comprising:

an electrically conductive rod that is constructed and arranged to pass through said first and second through holes and contact said reset terminal and said metal casing or mount to thereby electrically connect said reset terminal to said metal casing or mount.

11. The reset mechanism according to claim 2, wherein said reset terminal is exposed by there being no structure between said reset terminal and an outer end of said first through hole.

12. The reset mechanism according to claim 11, further comprising:

an electrically conductive rod that is constructed and arranged to pass through said first and second through holes and contact said reset terminal and said member of the electric device to thereby electrically connect said reset terminal to said member.

13. The reset mechanism according to claim 2, further comprising:

an electrically conductive rod that is constructed and arranged to pass through said first and second through holes and contact said reset terminal and said member of the electric device to thereby electrically connect said reset terminal to said member.

* * * * *